United States Patent [19]
Beaver

[11] Patent Number: 5,368,883
[45] Date of Patent: Nov. 29, 1994

[54] METHOD AND STENCIL DESIGN FOR PRINTING NON-PLANAR HYBRID CIRCUITS

[75] Inventor: Charles D. Beaver, Forest, Ind.

[73] Assignee: Delco Electronics Corp., Kokomo, Ind.

[21] Appl. No.: 64,473

[22] Filed: May 21, 1993

[51] Int. Cl.$^5$ .............................. C23C 26/00
[52] U.S. Cl. .................. 427/96; 427/97; 427/282; 427/404; 427/409; 101/127; 101/128.21; 101/128.4; 101/129
[58] Field of Search ............. 427/96, 97, 282, 404, 427/409; 101/128.21, 128.4, 129, 127

[56] References Cited

U.S. PATENT DOCUMENTS 4,678,531  7/1987  Metzger ............... 427/282
4,800,461  1/1989  Dixon .................. 427/97
4,919,969  4/1990  Walker ................. 101/129

OTHER PUBLICATIONS

L. M. Balents "A Metal Mask And Screen Assembly For Printing Thick-Film Onto Substrates Having Microminiature Devices Mounted Thereon" RCA TN 978, Sep., 1974, pp. 1-2.

Primary Examiner—Shrive Beck
Assistant Examiner—Vi Duong Dang
Attorney, Agent, or Firm—Cary W. Brooks; Mark A. Navarre

[57] ABSTRACT

The present invention includes a method and stencil design for printing on non-planar hybrid substrates wherein the stencil has a bottom face with a reverse topography to the non-planar hybrid substrate such that the stencil comes in direct contact and rest on the printing area immediately surrounding the print hole formed in the stencil. This eliminates any gap between the stencil and the surface of the substrate where material is to be printed. The stencil may be a metal and may be etched to provide the reversed topography.

4 Claims, 1 Drawing Sheet

METHOD AND STENCIL DESIGN FOR PRINTING NON-PLANAR HYBRID CIRCUITS

FIELD OF THE INVENTION

This invention relates to a method and stencil design for printing materials on non-planar surfaces on hybrid substrates or circuit boards.

BACKGROUND OF THE INVENTION

Printing materials on non-planar hybrid substrates has heretofore been difficult. The problem associated with printing solder for fine-pitch devices of non-planar hybrid substrates is caused by a buildup of conductor and dielectric required in the hybrid circuit design. FIG. 1 illustrates a prior method of printing with a stencil on a hybrid circuit. In such a system, a first conductor 10 is printed on a substrate 12. In order to form overlapping conductors with the first conductor, a first and second dielectric layer 14, 16 is printed over the first conductor 10 to electrically isolate the same. At least a second conductor 18 is printed over the dielectric layers usually in a perpendicular direction to the first conductor. If a solder paste joint is needed in contact with the first conductor, a metal stencil 20 having a hole 22 formed therein is used to print the solder paste in a desired location on the first conductor. However, as can be seen from FIG. 1, when a flat stencil is utilized, a gap 24 exist between the bottom surfaces 26 of the stencil adjacent the hole through which the solder paste will flow. This often relates to inaccurate placement of the solder paste. Even worst, this method of printing usually results in solder paste being forced (wicked or spread) along the bottom surface 26 of the stencil adjacent the hole formed therein. Consequently, the print operator must wipe the bottom of the stencil each time to insure that the solder paste does not cause an electrical contact to be provided between the first conductor and the second conductor. Bridging (yield loss) may occur if the solder at two adjacent print locations is forced together. The present invention overcomes these deficiencies and the prior art.

SUMMARY OF THE INVENTION

The present invention includes a method and stencil design for printing on non-planar hybrid substrates wherein the stencil has a bottom face with a reverse topography to the non-planar hybrid substrate such that the stencil comes in direct contact and rest on the printing area immediately surrounding the print hole formed in the stencil. This eliminates any gap between the stencil and the surface of the substrate where material is to be printed. The stencil may be a metal and may be etched to provide the reversed topography.

DETAILED DESCRIPTION OF THE INVENTION

Figure 1:
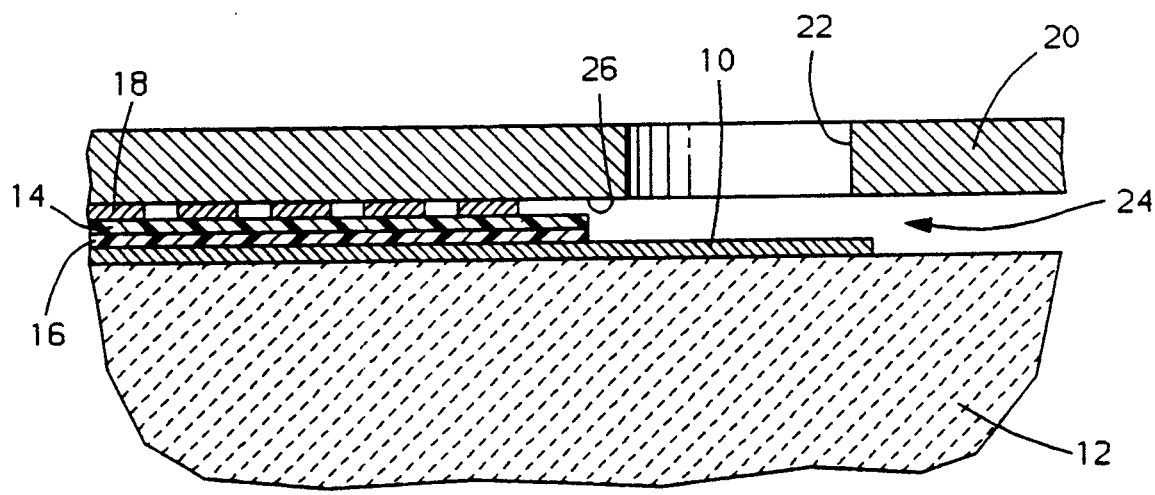
FIG. 1 is an illustration of a prior method of printing on non-planar hybrid substrates.
Figure 2:
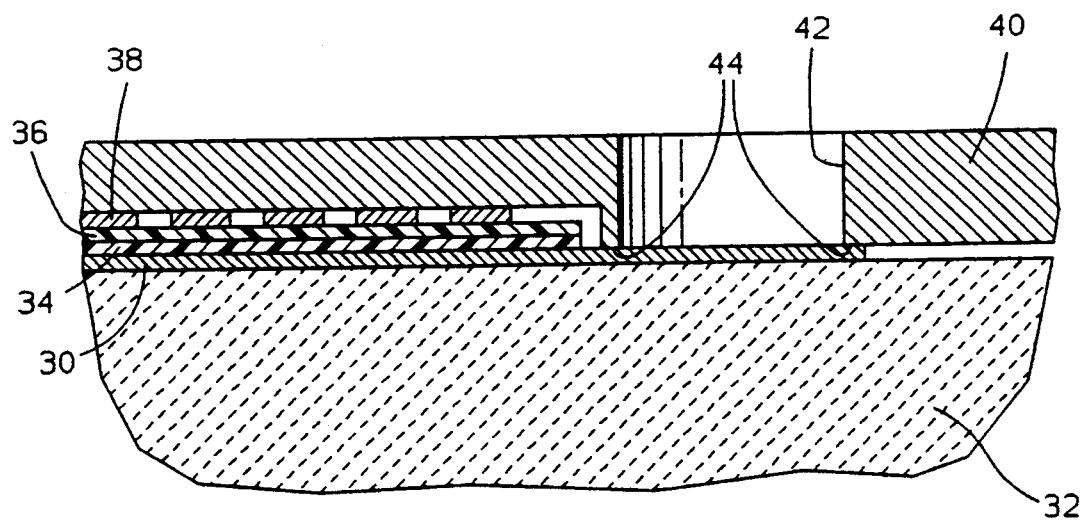
FIG. 2 is an illustration of a method and stencil design for printing on non-planar hybrid substrates according to the present invention.

FIG. 2 illustrates a method and stencil design for printing on non-planar hybrid substrates according to the present invention. Similar to the description of FIG. 1, FIG. 2 illustrates a first conductive layer 30 printed on a substrate 32. First and second dielectric layers 34, 36 are printed over the first conductive layer 30 to isolate the same. At least a second conductive layer 38 is printed on top of the dielectric layers usually in a direction perpendicular to the first conductive layer 30. According to the present invention, if a solder paste joint is to be printed on an area of the first conductor 30, a stencil 40 having a hole 42 formed therein for printing the solder paste therethrough is utilized. The stencil has a non-planar bottom face and is constructed and arranged so that substantially flat surfaces 44 directly contact and rest on the first conductor 30 immediately around the area where the solder paste is to be printed. The bottom surface of the stencil has portions removed to accommodate the non-planar surface caused by the overlapping dielectric and conductor layers. A suitable material for the stencil is a metal and portions of the bottom surface may be removed by etching techniques known to those skilled in the art. Although not absolutely necessary, the bottom surface of the stencil may be the reversed image of the topography of the non-planar hybrid circuit. Provided that the substantially flat surfaces of the bottom face of the stencil 44 contact directly the first conductor in an area immediately surrounding the hole formed in the stencil, an accurately positioned solder paste joint may be printed without smearing and without the requirement of cleaning the bottom surface of the stencil with each print. The stencil design of the present invention provides a seal between the stencil and the conductor where the solder is to be printed. The stencil design also allows for circuit size reduction because the dielectric may be moved in closer proximity to the fine-print pitch area due to the accuracy of the printing with a stencil. The method may be used to print a variety of materials for example solder paste joints, thick film inks, and fluxes.

The embodiments of the invention in which an exclusive property or privilege is claimed are defined as follows:

1. A method of printing on a non-planar surface comprising the steps of:
   providing a substrate having a first conductor layer of a portion of an electrical circuit printed thereon, a dielectric layer isolating a portion of said first conductor, and a second conductor printed on said dielectric layer, and wherein said first conductor has a portion extending outwardly from that portion of the first conductor covered by the dielectric layer;
   placing a stencil over a portion of said circuit so that a hole formed in said stencil aligns with the outwardly extending portion of said first conductor, said stencil having a recessed lower surface resting on said second conductor and an unrecessed lower surface resting on said outwardly extending portion of the first conductor in an area immediately adjacent to the hole formed in the stencil to form a seal between the stencil and the first conductor; and
   printing a material through the hole formed in the stencil so that the seal prevents printed material from wicking along the unrecessed lower surface of the stencil.

2. A method as set forth in claim 1 wherein said material comprises a solder paste.

3. A method as set forth in claim 1 wherein said printed material is at least one selected from the group consisting of a solder paste, thick film ink, and flux.

4. A method of printing on a non-planar surface comprising the steps of:

providing a substrate having an electrical circuit having a first portion which is substantially flat and a second portion which is elevated relative to said first portion;

placing a stencil over said substrate, said stencil having a hole formed therein that is aligned to print a material through the stencil onto said first portion of the substrate, said stencil having a recessed lower surface resting on said elevated second portion of the substrate and an unrecessed lower portion resting on said first portion of the substrate immediately adjacent the hole formed in the stencil to provide a seal between the stencil and the first portion of the substrate where the material is to be printed so that the printed material does not wick along the unrecessed lower surface of the stencil; and printing the material through the hole formed in the stencil.

* * * * *